United States Patent
Chen et al.

(10) Patent No.: US 8,418,357 B2
(45) Date of Patent: Apr. 16, 2013

(54) PRINTED CIRCUIT BOARD LAYOUT METHOD

(75) Inventors: Yung-Chieh Chen, Taipei Hsien (TW); Cheng-Shien Li, Taipei Hsien (TW); Shou-Kuo Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 1032 days.

(21) Appl. No.: 12/329,614

(22) Filed: Dec. 7, 2008

(65) Prior Publication Data

US 2010/0012363 A1    Jan. 21, 2010

(30) Foreign Application Priority Data

Jul. 15, 2008  (CN) .......................... 2008 1 0302746

(51) Int. Cl.
*H05K 3/30* (2006.01)
*H01R 43/00* (2006.01)

(52) U.S. Cl.
USPC ............................................. 29/832; 29/825

(58) Field of Classification Search .................... 29/832, 29/825, 831, 846, 854; 174/250–251, 255–256, 174/258–263
See application file for complete search history.

(56) References Cited

U.S. PATENT DOCUMENTS

| | | | | |
|---|---|---|---|---|
| 3,716,907 A | * | 2/1973 | Anderson | 438/120 |
| 5,097,390 A | * | 3/1992 | Gerrie et al. | 361/784 |
| 5,346,118 A | * | 9/1994 | Degani et al. | 228/180.22 |
| 5,453,582 A | * | 9/1995 | Amano et al. | 174/261 |
| 5,495,089 A | * | 2/1996 | Freedman et al. | 219/121.64 |
| 5,509,597 A | * | 4/1996 | Laferriere | 228/105 |
| 5,523,920 A | * | 6/1996 | Machuga et al. | 361/767 |
| 5,788,143 A | * | 8/1998 | Boyd et al. | 228/253 |
| 6,010,060 A | * | 1/2000 | Sarkhel et al. | 228/179.1 |
| 6,048,430 A | * | 4/2000 | Johnston | 156/233 |
| 6,121,553 A | * | 9/2000 | Shinada et al. | 174/259 |
| 6,545,229 B1 | * | 4/2003 | Ma et al. | 174/263 |
| 7,489,154 B2 | * | 2/2009 | Tang | 324/762.02 |
| 7,790,268 B2 | * | 9/2010 | Kennedy | 428/209 |

* cited by examiner

*Primary Examiner* — David Angwin
(74) *Attorney, Agent, or Firm* — Altis Law Group, Inc.

(57) ABSTRACT

A printed circuit board layout method includes the following steps. Providing a printed circuit board with a first layout layer and a second layout layer. Disposing a pair of first conducting portions on the first layout layer to electrically couple to a control chip. Sequentially disposing a pair of second conducting portions, a pair of third conducting portions, and a pair of fourth conducting portions on the second layout layer. Providing a pair of connecting portions to connect the first conducting portions and the third conducting portions. Electrically connecting an electronic device to the second conducting portions, and providing a first and second components are coupled with the third and fourth conducting portions, or electrically coupling the electronic device to the fourth conducting portions, and providing the first and the second components are coupled with the second and third conducting portions.

6 Claims, 7 Drawing Sheets

PRINTED CIRCUIT BOARD LAYOUT METHOD

BACKGROUND

1. Technical Field

The invention relates to layout of a circuit board and, more particularly, to a printed circuit board and layout method thereof.

2. Description of Related Art

Printed circuit boards are designed for coupling control chips and electronic devices in two alternative modes to transmit signals such as high-speed differential signals.

Referring to FIG. 4, a commonly used printed circuit board 1 includes a pair of first transmission lines 11A, 11B, a pair of second transmission lines 12A, 12B, and a pair of third transmission lines 13A, 13B sequentially arranged thereon.

Referring to FIG. 5, in a first coupling mode, a control chip 14 is coupled to the first transmission lines 11A, 11B, and a first electronic device 15 is coupled between the second transmission lines 12A, 12B, and the first transmission lines 11A, 11B. The control chip 14 generates a pair of high-speed signals S1, S2 such as high-speed differential signals. However, a circuit stub is thus created. Referring to FIG. 6, in a second coupling mode, the control chip 14 is coupled to the first transmission lines 11A, 11B, a second electronic device 16 is coupled to ends of the third transmission lines 13A, 13B away from the control chip 14, and a pair of resistors R1, R2 must be added to connect with the second transmission lines 12A, 12B and the third transmission lines 13A, 13B. Cost of the printed circuit board 1 is increased accordingly.

DETAILED DESCRIPTION

Figure 1:
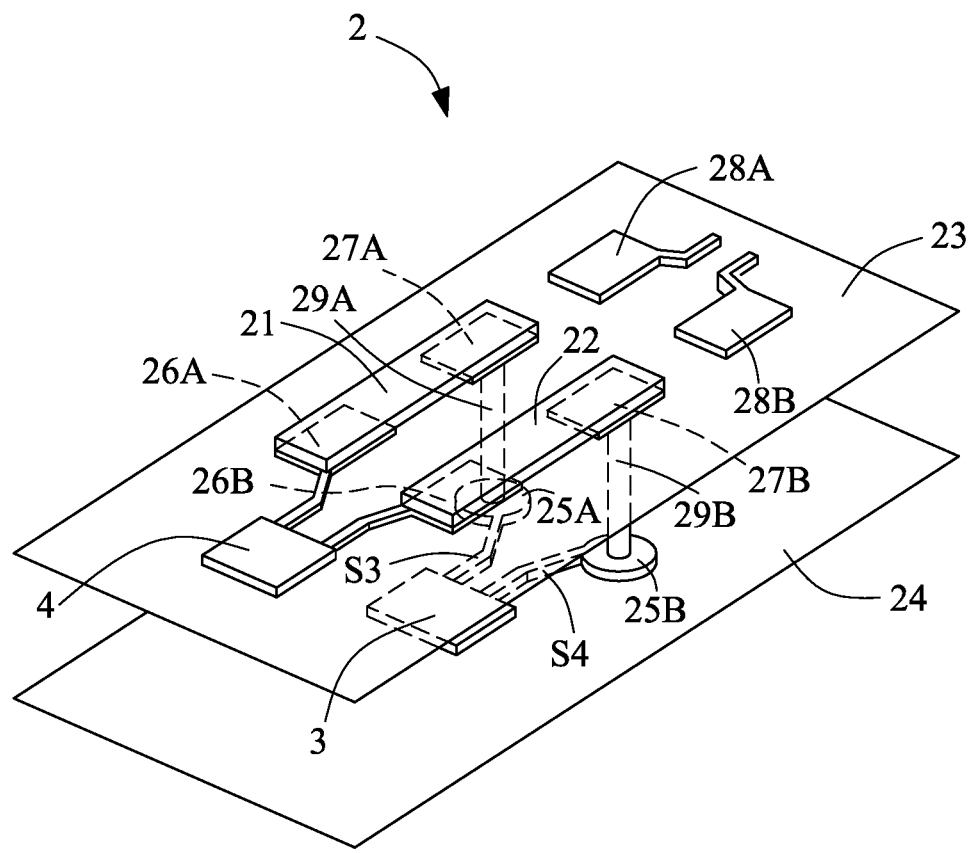
FIG. 1 is an exploded, isometric view of a printed circuit board in a first coupling mode, in accordance with an embodiment.

Referring to FIG. 1, an embodiment of a printed circuit board 2 comprises an electronic device 4, a first component 21, and a second component 22 coupled thereto in two alternate coupling modes. The printed circuit board 2 also includes a first layout layer 24, a second layout layer 23, an isolating layer (not shown) disposed between the first layout layer 24 and the second layout layer 23, a pair of connecting portions 29A, 29B, and a control chip 3. The printed circuit board 2 can be, for example, a motherboard.

The first layout layer 24 includes a pair of first parallel conducting portions 25A, 25B, such as, a pair of solder pads.

The second layout layer 23 includes a pair of second parallel conducting portions 26A, 26B, a pair of third parallel conducting portions 27A, 27B, and a pair of fourth parallel conducting portions 28A, 28B, sequentially arranged on the second layout layer 23 in corresponding linear alignments. The third conducting portions 27A, 27B are coupled with the first conducting portions 25A, 25B, respectively, by the connecting portions 29A, 29B. The connecting portions 29A, 29B are a pair of vias or embedded vias.

For example, the first component 21 and the second component 22 can be capacitors or resistors. In this embodiment, the first component 21 and the second component 22 are alternating current (AC) coupling capacitors.

In a first coupling mode, the control chip 3 is coupled with the first conducting portions 25A, 25B and generates a pair of high-speed differential signals S3, S4. The high-speed signals S3, S4 are transmitted to the third conducting portions 27A, 27B by the first conducting portions 25A, 25B via a pair of transmission lines (not labeled). The electronic device 4 is coupled with the second conducting portions 26A, 26B. Two ends of the first component 21 are coupled with one of the second conducting portions 26A and one of the third conducting portions 27A. Two ends of the second component 22 are coupled with the other second conducting portion 26B and the other third conducting portion 27B. The high-speed signals S3, S4 are transmitted to the electronic device 4, sequentially passing through the first conducting portions 25A, 25B, the connecting portions 29A, 29B, the third conducting portions 27A, 27B, the first component 21, the second component 22, and the second conducting portions 26A, 26B.

Figure 2:
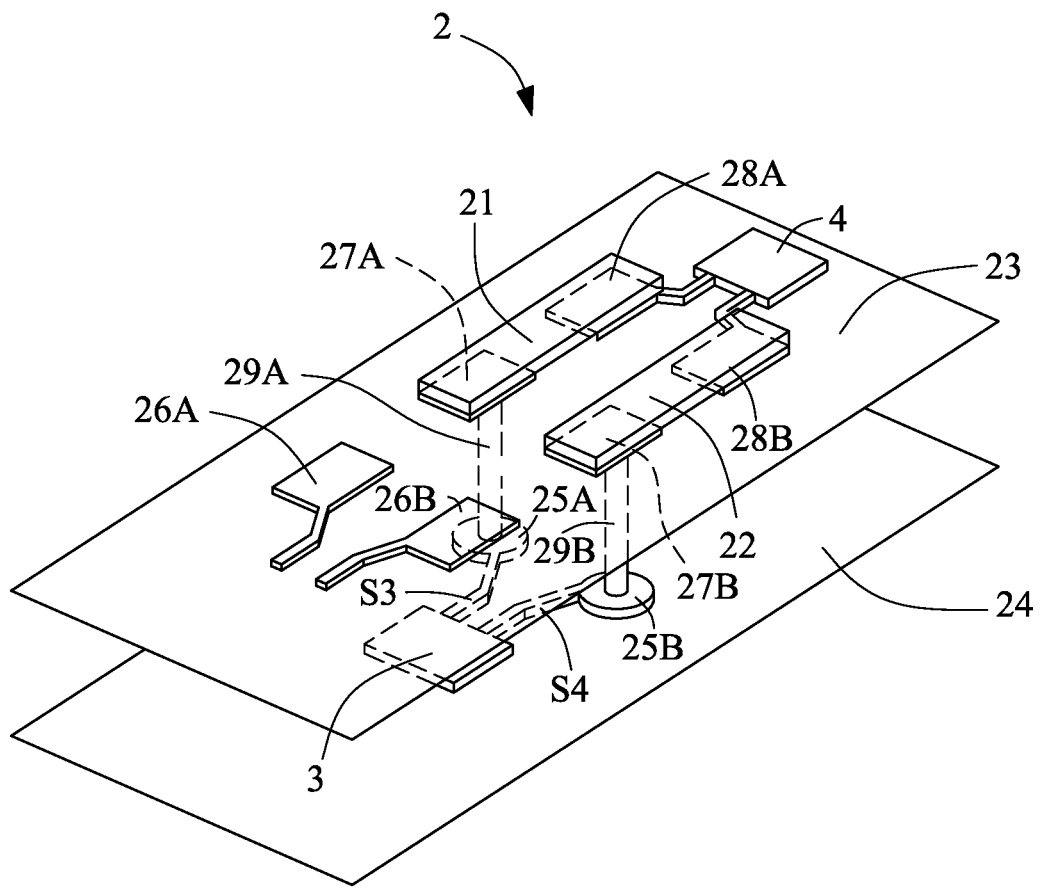
FIG. 2 is an exploded, isometric view of the printed circuit board of FIG. 1 in a second coupling mode.

Referring to FIG. 2, in a second coupling mode, the electronic device 4 is coupled with the fourth conducting portions 28A, 28B. Two ends of the first component 21 are coupled with one of the third conducting portions 27A and one of the fourth conducting portions 28A. Two ends of the second component 22 are coupled with one of the third conducting portions 27B and one of the fourth conducting portions 28B. The control chip 3 remains coupled with the first conducting portions 25A, 25B. The high-speed signals S3, S4 are transmitted to the electronic device 4, sequentially passing through the first conducting portions 25A, 25B, the connecting portions 29A, 29B, the third conducting portions 27A, 27B, the first component 21, the second component 22, and the fourth conducting portions 28A, 28B.

Also provided is a layout method for a printed circuit board.

Figure 3A:
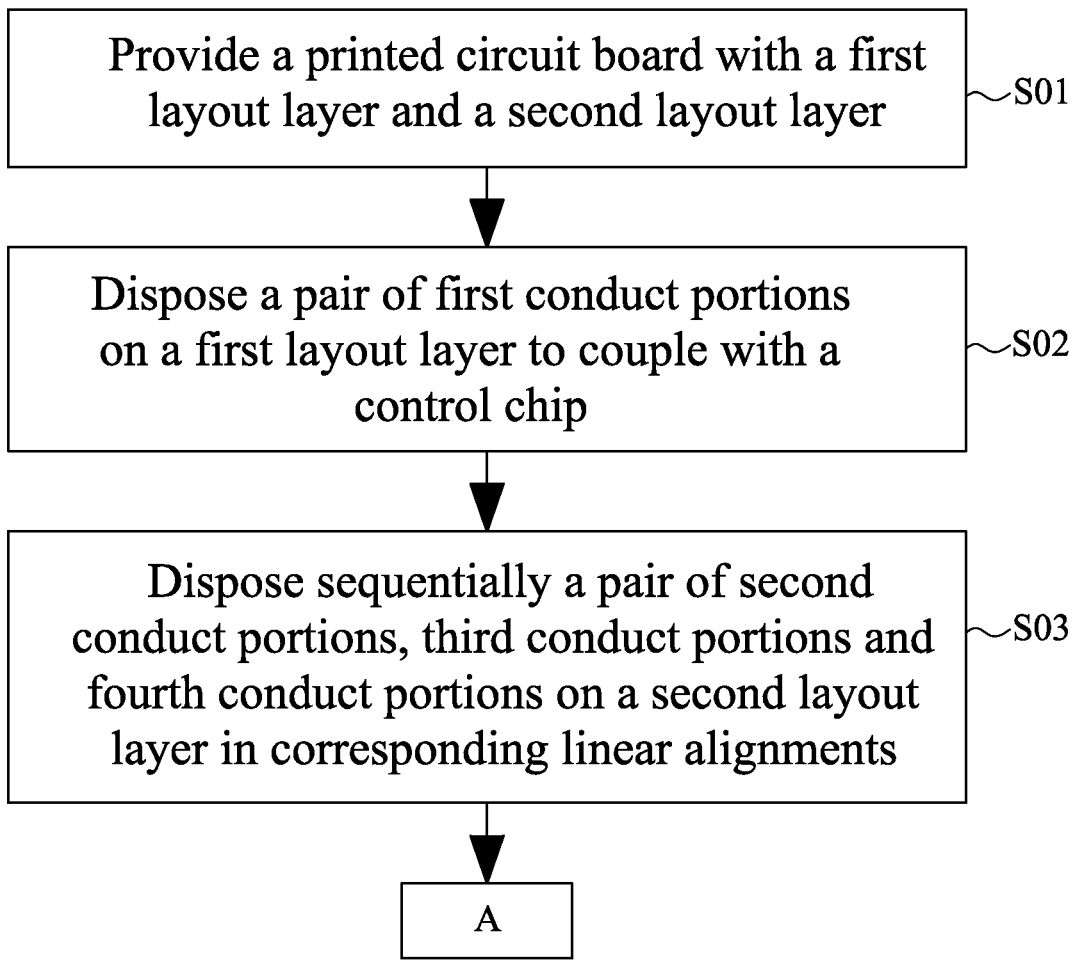
FIGS. 3A, 3B are flowcharts of a printed circuit board layout method for a printed circuit board in accordance with an embodiment.
Figure 3B:
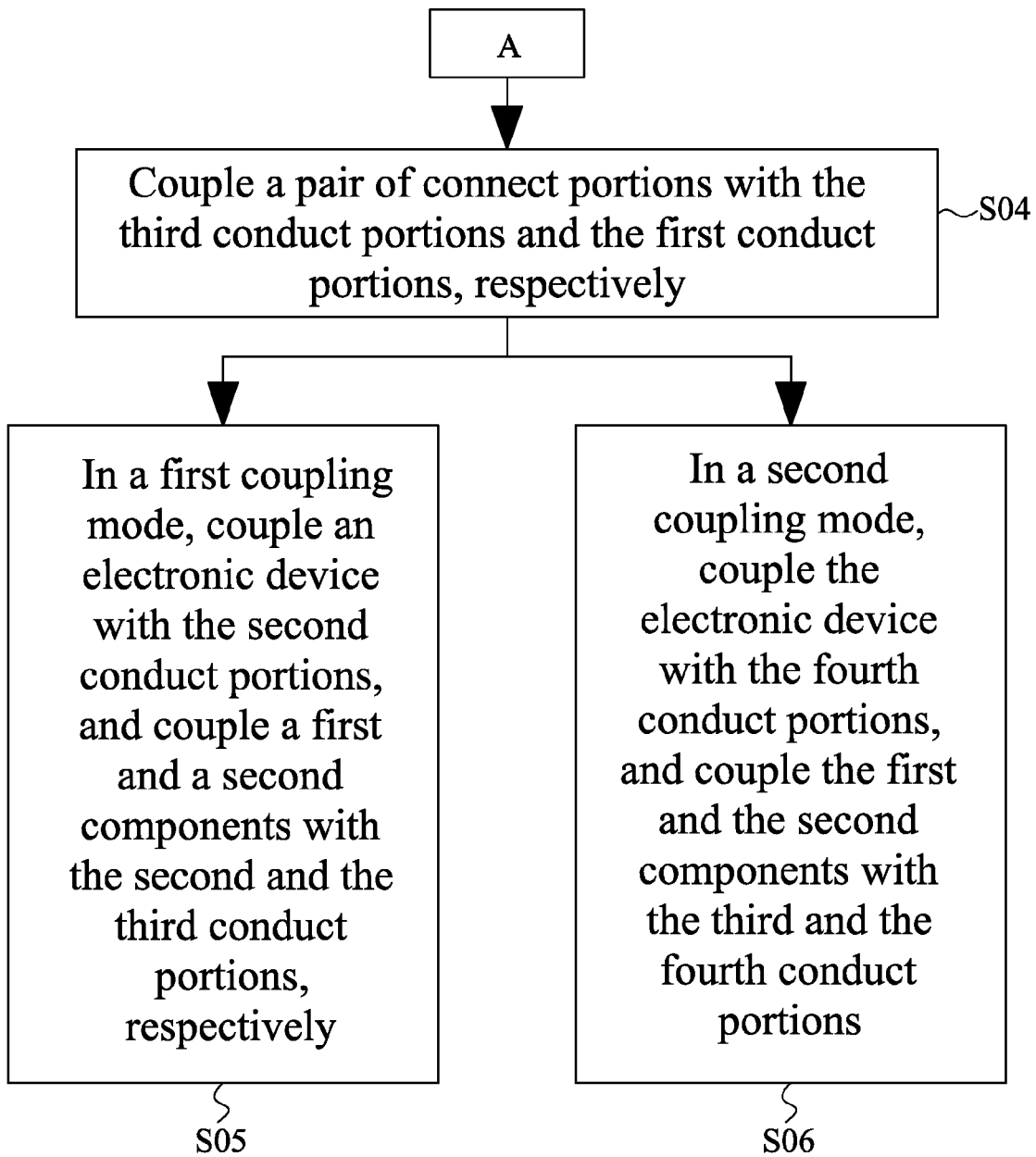
Figure 4:
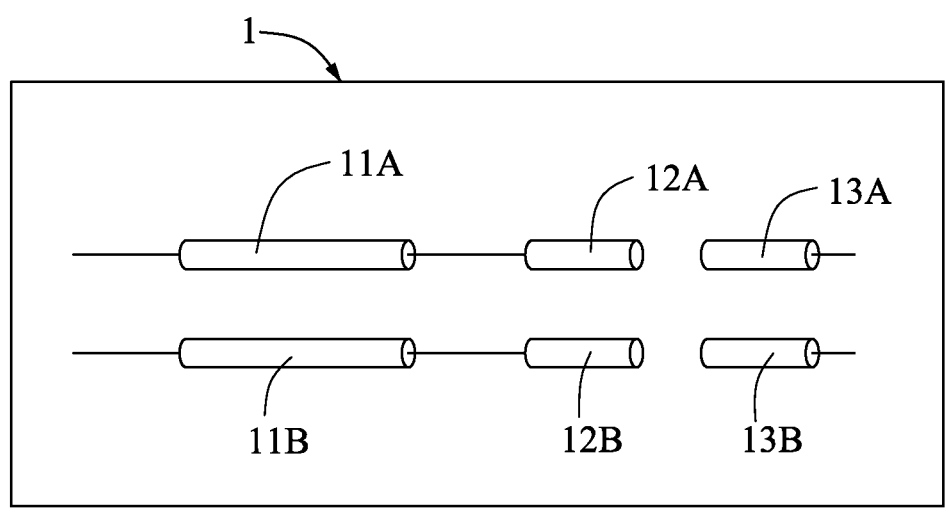
FIG. 4 is a schematic view of a commonly used printed circuit board.
Figure 5:
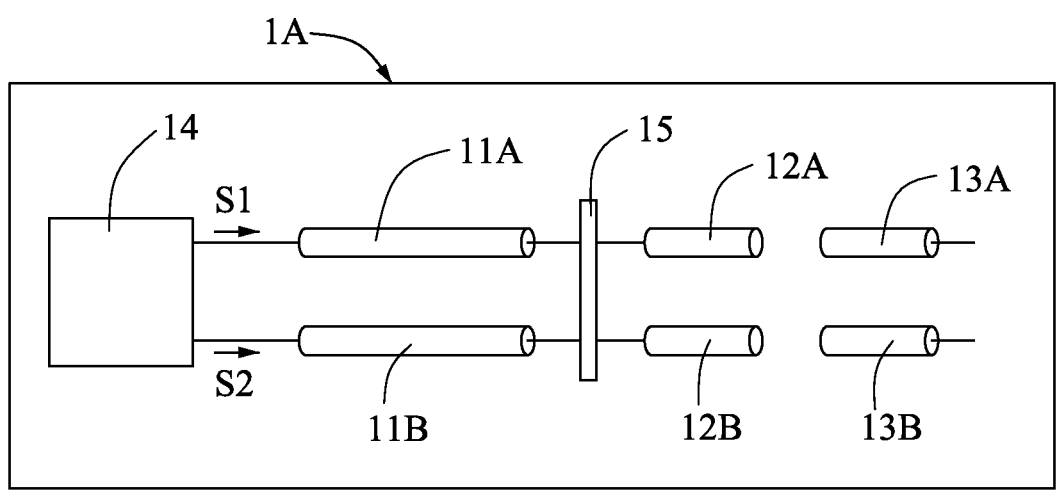
FIG. 5 is a schematic view of the commonly used printed circuit board of FIG. 4, showing a first electronic device coupled therewith.
Figure 6:
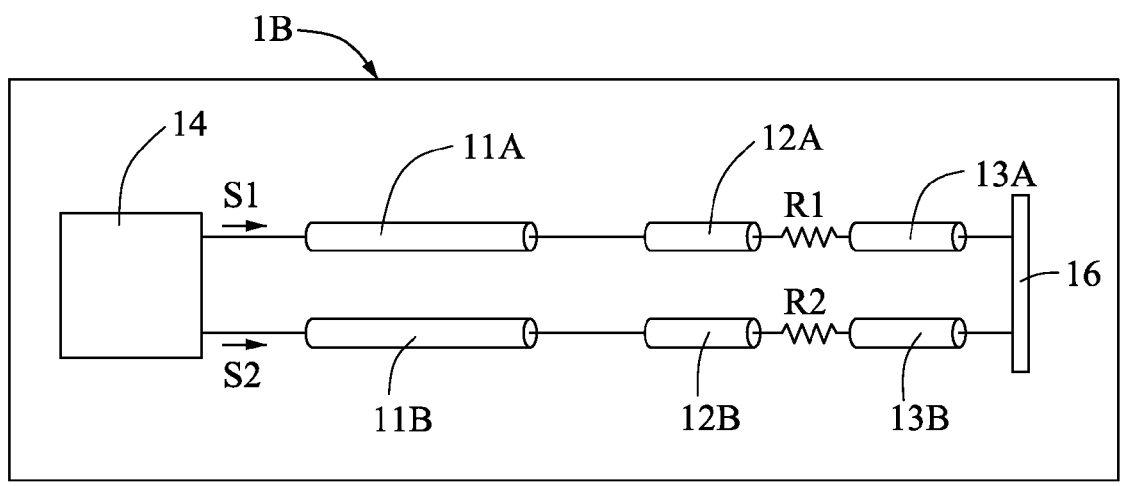
FIG. 6 is a schematic view of the commonly used printed circuit board of FIG. 4, showing a second electronic device coupled therewith.

As shown in FIGS. 3A 3B, the printed circuit board layout method includes, in step S01, providing a printed circuit board 2 with a first layout layer 24, and a second layout layer 23.

In step S02, a pair of first conducting portions 25A, 25B is disposed on a first layout layer 24 of the printed circuit board 2 to couple with a control chip.

In step S03, a pair of second conducting portions 26A, 26B, third conducting portions 27A, 27B, and fourth conducting portions 28A, 28B are sequentially disposed on a second layout layer 23 of the printed circuit board 2 in corresponding linear alignments.

In step S04, a pair of connecting portions 29A, 29B is coupled with the third conducting portions 27A, 27B and the first conducting portions 25A, 25B, respectively.

In step S05, in a first coupling mode, an electronic device 4 is coupled with the second conducting portions 26A, 26B, a first component 21 is coupled with one of the second conducting portions 26A and one of the third conducting portions 27A, and a second component 22 is coupled with the other second conducting portion 26B and the other third conducting portion 27B.

In step S06, in a second coupling mode, the electronic device 4 is coupled with the fourth conducting portions 28A, 28B, the first component 21 is coupled with one of the third conducting portions 27A and one of the fourth conducting portions 28A, and the second component 22 is coupled with the other third conducting portion 27B and the other fourth conducting portion 28B.

The printed circuit board 2 positions the first component 21 and the second component 22 and the electronic device 4 in two different coupling modes. In this way, it is unnecessary for the printed circuit board 2 to bear additional components to satisfy two alternative coupling positions.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board layout method comprising:
    providing a printed circuit board with a first layout layer, and a second layout layer;
    disposing a pair of first conducting portions on the first layout layer to electrically couple to a control chip;
    sequentially disposing a pair of second conducting portions, a pair of third conducting portions and a pair of fourth conducting portions on the second layout layer;
    providing a pair of connecting portions to respectively connect the first conducting portions of the first layout layer and the third conducting portions of the second layout layer;
    electrically coupling an electronic device to the second conducting portions, and providing a first component to electrically connect one of the second conducting portions and a corresponding one of the third conducting portions, and a second component to electrically connect the other one of the second conducting portions and the other one of the third conducting portions to form a first route; or electrically coupling the electronic device to the fourth conducting portions, and providing the first component to electrically connect one of the fourth conducting portions to a corresponding one of the third conducting portions, and the second component to electrically connect the other one of the fourth conducting portions to the other one of the third conducting portions to form a second route; and
    transmitting a pair of high-speed differential signals generated by the control chip to the electronic device, via the first conducting portions, the connecting portions, the third conducting portions, the first and second components, and the second conducting portions in turn in response to the first route being formed, or via the first conducting portions, the connecting portions, the third conducting portions, the first and second components, and the fourth conducting portions in turn in response to the second route being formed.

2. The method as claimed in claim 1, wherein the connecting portions are a pair of vias or a pair of embedded vias.

3. The method as claimed in claim 1, wherein the first component and the second component are resistors. status identifier.

4. The method as claimed in claim 1, wherein the first component and the second component are capacitors.

5. The method as claimed in claim 4, wherein each capacitor is an alternating current coupling capacitor.

6. The method as claimed in claim 1, wherein in the sequentially disposing step, the pair of second conducting portions, the pair of third conducting portions and the pair of fourth conducting portions are arranged in corresponding linear alignments.

* * * * *